US012604717B2

(12) United States Patent
Cheng

(10) Patent No.: US 12,604,717 B2
(45) Date of Patent: Apr. 14, 2026

(54) SEMICONDUCTOR STRUCTURE AND METHOD OF MANUFACTURING THE SAME

(71) Applicant: NANYA TECHNOLOGY CORPORATION, New Taipei City (TW)

(72) Inventor: Min-Chung Cheng, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 385 days.

(21) Appl. No.: 18/310,539

(22) Filed: May 2, 2023

(65) Prior Publication Data

US 2024/0371686 A1     Nov. 7, 2024

(51) Int. Cl.
H01L 21/768 (2006.01)
H01L 21/311 (2006.01)
H01L 23/528 (2006.01)

(52) U.S. Cl.
CPC .. H01L 21/76816 (2013.01); H01L 21/31144 (2013.01); H01L 21/76831 (2013.01); H01L 23/528 (2013.01)

(58) Field of Classification Search
CPC .................................................. H01L 21/7681
See application file for complete search history.

(56) References Cited

U.S. PATENT DOCUMENTS

| | | | |
|---|---|---|---|
| 2016/0276464 A1 * | 9/2016 | Liu ........................ | H10D 30/60 |
| 2019/0035792 A1 * | 1/2019 | Lu ......................... | H10D 64/513 |
| 2020/0168611 A1 * | 5/2020 | Jeon ..................... | H10B 12/482 |
| 2022/0077155 A1 * | 3/2022 | Huang .................. | H10D 30/60 |

FOREIGN PATENT DOCUMENTS

| | | |
|---|---|---|
| TW | 202215642 A | 4/2022 |
| TW | 202310187 A | 3/2023 |

* cited by examiner

*Primary Examiner* — Mounir S Amer
(74) *Attorney, Agent, or Firm* — CKC & Partners Co., LLC

(57) ABSTRACT

A method of manufacturing a semiconductor structure is provided by embodiments of this disclosure, and the method includes the following steps. An insulating area and an active area are formed in a substrate. A first word line trench is formed in the active area. A first dielectric layer is deposited in the first word line trench and on the active area and the insulating area. A second word line trench is formed through etching the first dielectric layer. Besides, the second word line trench is linear and extends through the insulating area and the active area of the substrate, and a portion of the first dielectric layer is remained in a bottom of the second word line trench. Then, a word line structure is formed in the second word line trench. Moreover, a semiconductor structure is provided in this disclosure.

5 Claims, 15 Drawing Sheets

SEMICONDUCTOR STRUCTURE AND METHOD OF MANUFACTURING THE SAME

BACKGROUND

Field of Invention

The present disclosure relates to a semiconductor structure and a method of manufacturing the same. More particularly, the present disclosure relates to a semiconductor structure with a word line structure and a method of manufacturing the semiconductor structure with a word line structure.

Description of Related Art

As electronic devices become lighter and thinner, semiconductor devices, such as dynamic random access memory (DRAM) become more highly integrated. Further, the performance of the DRAM is improved via shortening the pitch between the semiconductor structures in the DRAM. Due to shrinking the size of the semiconductor structure, in addition to increasing the difficulty of the manufacturing process, the components in the semiconductor structures are also prone to leakage resulting from too close distances.

As a result, in the semiconductor manufacturing process, how to reduce the leakage to improve the process yield of the semiconductor structure has become an important issue.

SUMMARY

Embodiments of this disclosure provide a method of manufacturing a semiconductor structure, and the method includes the following steps. An insulating area and an active area are formed in a substrate. Besides, the active area is adjacent to the insulating area. A first word line trench is formed in the active area. A first dielectric layer is deposited in the first word line trench and on the active area and the insulating area. A second word line trench is formed in the active area and the insulating area through etching the first dielectric layer. Besides, the second word line trench is linear and extends through the insulating area and the active area, and a portion of the first dielectric layer is remained in a bottom of the second word line trench. Also, a word line structure is formed in the second word line trench.

In some embodiments, the first word line trench has a first depth, and the second word line trench has a second depth. Besides, the first depth is greater than the second depth.

In some embodiments, the first dielectric layer is deposited such that a height of the first dielectric layer above the active area is equivalent to the second depth of the second word line trench.

In some embodiments, forming the first word line trench in the active area includes the following steps. A first mask layer is formed on the insulating area and a first part of the active area. Besides, the first mask layer has a first opening exposing a second part of the active area. The second part of the active area is etched through the first opening such that the first word line trench is formed in the active area.

In some embodiments, forming the second word line trench in the substrate includes the following steps. A second mask layer is formed over a first part of the insulating area and a third part of the active area. Besides, the second mask layer has a second opening exposing a fourth part of the active area, and the second mask layer has a third opening exposing a second part of the insulating area. The fourth part of the active area is etched through the second opening and the second part of the insulating area through the third opening such that the second word line trench is formed in the active area and the insulating area.

In some embodiments, a first width of the second opening is identical to a second width of the third opening.

In some embodiments, forming the active area on the substrate includes the following step. A source/drain region is formed in the active area of the substrate. Also, the source/drain has a third depth.

In some embodiments, the first depth is greater than the third depth.

In some embodiments, the second depth is greater than the third depth.

In some embodiments, forming the word line structure in the second word line trench includes the following steps. A liner dielectric layer is formed on an inner surface of the second word line trench, and the liner dielectric layer includes a bottom portion and a side portion. A conductive layer is formed within the second word line trench and contacting the bottom portion and the side portion. As well, a cap layer is formed within the second word line trench and stacks on the conductive layer.

In some embodiments, the liner dielectric layer includes a bottom liner dielectric layer and a side liner dielectric layer. Also, a bottom of the word line structure comprises the portion of the first dielectric layer and the bottom liner dielectric layer.

In some embodiments, a dielectric material of the liner dielectric layer is an oxide or a high dielectric constant material.

In some embodiments, a dielectric material of the first dielectric layer is an oxide.

In some embodiments, the first dielectric layer is deposited through an atomic layer deposition process.

Embodiments of this disclosure also provide a semiconductor structure. The semiconductor structure includes a substrate and a word line structure. The substrate includes an insulating area and an active area. The word line structure is linear and extends through the insulating area and the active area, and the word line structure includes a conductive layer and a dielectric layer. Besides, the dielectric layer includes a bottom portion contacting a bottom of the conductive layer and a side portion contacting a sidewall of the conductive layer, and the bottom portion of the dielectric layer is thicker than the side portion of the dielectric layer.

In some embodiments, the word line structure further includes a cap layer, and the cap layer is disposed on the conductive layer.

In some embodiments, the bottom portion of the dielectric layer comprises a bottom dielectric layer and a bottom liner dielectric layer, and an interface is between the bottom dielectric layer and the bottom liner dielectric layer.

In some embodiments, the active area comprises a plurality of source/drain regions, and the plurality of the source/drain regions are disposed on opposite sides of the conductive layer.

In some embodiments, a depth of the word line structure is a first depth, a depth of the bottom liner dielectric layer of the word line structure is a second depth, and a depth of each of the plurality of source/drain regions is a third depth.

In some embodiments, the first depth is greater than the second depth, and the second depth is greater than the third depth.

Via the method of manufacturing the semiconductor structure provided by the embodiments of the present disclosure, before forming the word line structure, the first word line trench is formed in the active area, and the depth of the first word line trench is greater than that of the word line structure. Consequently, only the etching rate of the dielectric material needs to be taken into account during the etching process of forming the word line structure. As well, the etching depth of the word line structure can be better controlled and consistent. Therefore, the semiconductor structure provided by the embodiments of the present disclosure can reduce the problems of leakage and have the better performance.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11-14 are views of a method of manufacturing a semiconductor structure during forming word line structures according some embodiments of the present disclosure.

DETAILED DESCRIPTION

Figure 1:
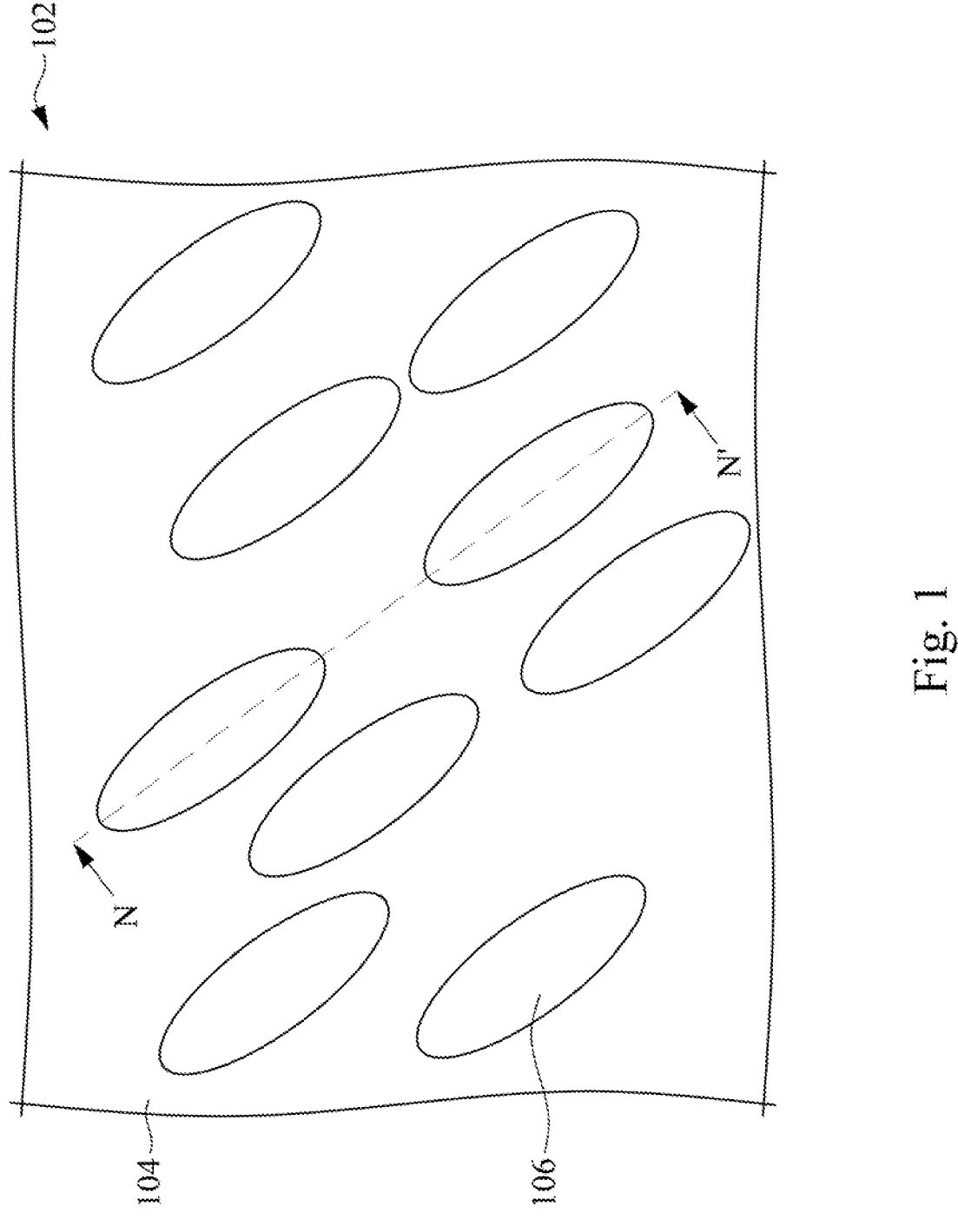
FIGS. 1-3 are views of a method of manufacturing a semiconductor structure during forming insulating areas and active areas according some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Further, spatially relative terms, such as "on," "over," "under," "between" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The words "comprising", "including", "having", "containing" and the like used in the present disclosure are open terms, meaning including but not limited to.

In the technology of etching the word line trench in the related art, the word line usually extends through two materials of the substrate, such as silicon in the active area and the dielectric material (eg, oxide) in the insulating area. The etching rates of the two materials in the substrate are different. Therefore, after the process of etching the word line trench, the depth of the word line trench in the insulating area and the depth of the word line trench in the active area are different, which result in electrical problems.

According to various embodiments of the present disclosure, parts of the active area can be etched through a mask layer with an opening after forming the active area and the insulating area in the substrate. Then, the dielectric material is refilled over the substrate. Consequently, only the dielectric material needs to be etched during the semiconductor structure manufacturing process of the word line structure. In this way, in the semiconductor structure manufacturing process, it is easier to control the depth of the word line structure. Also, the semiconductor structure with the better performance of can be obtained.

It should be noted that when the following figures, such as FIG. 1 to FIG. 14, are illustrated and described as a series of operations or steps, the description order of these operations or steps should not be limited. For example, some operations or steps may be undertaken in a different order than in the present disclosure, or some operations or steps may occur currently, or some operations may not be used, and/or some operations or steps may be repeated. Moreover, the actual operations or steps of process stages may require additional operations or steps before, during or after forming the semiconductor structure (for example, a semiconductor structure 100 in FIG. 14) to completely form the semiconductor structure 100. Therefore, the present disclosure may briefly illustrate some of these additional operations or steps. Further, unless otherwise stated, the same explanations discussed for the following figures, such as FIG. 1 to FIG. 14, apply directly to the other figures.

Figure 2:
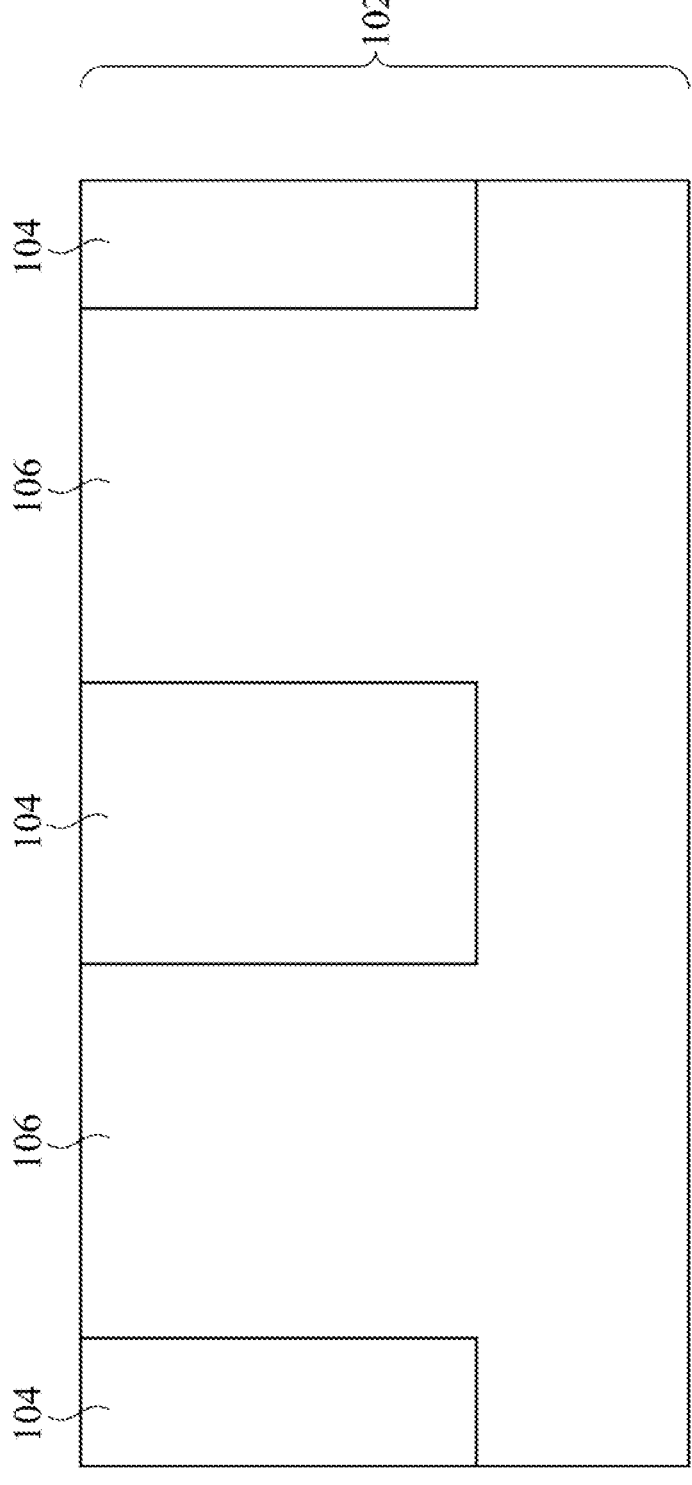
Figure 3:
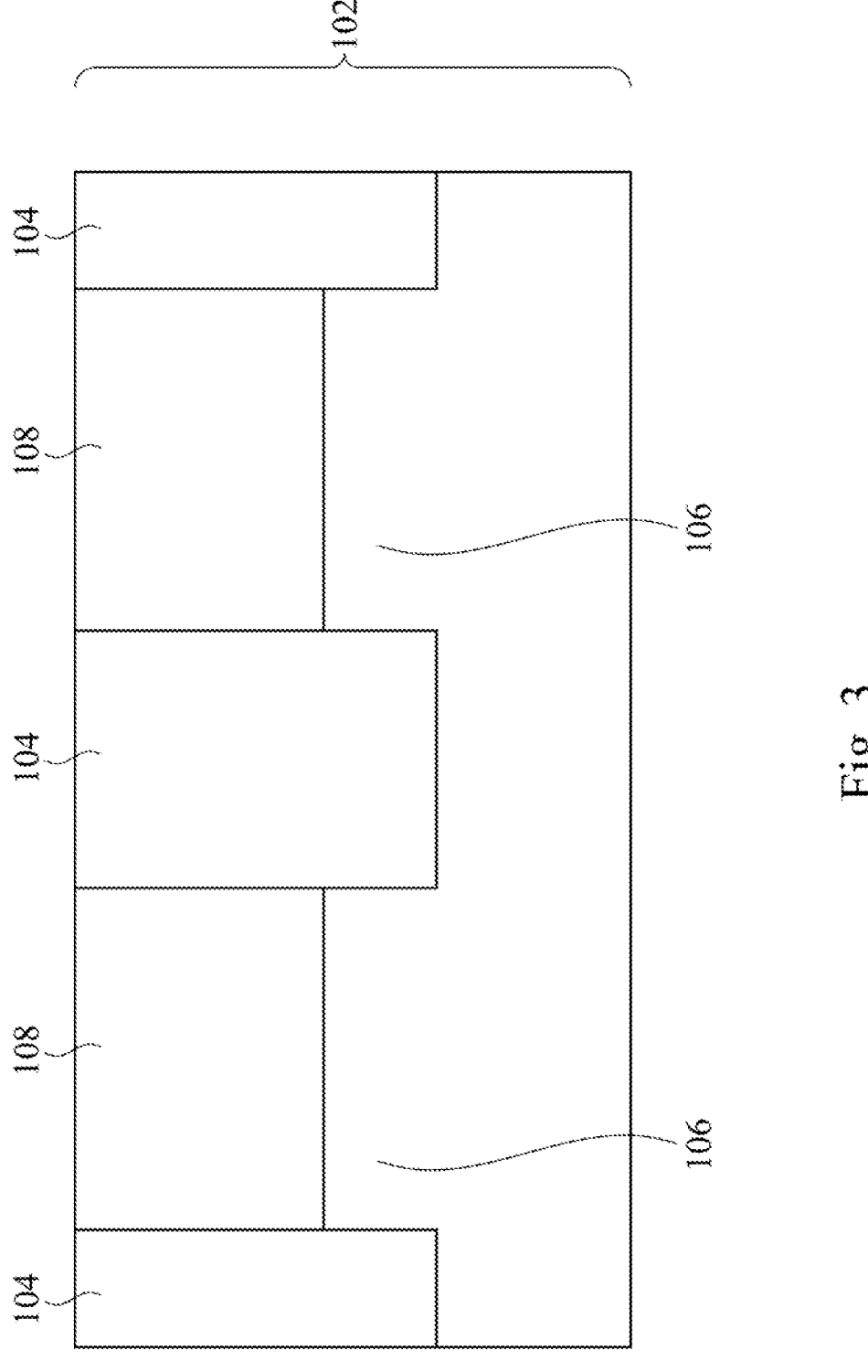

Please refer to FIGS. 1-3, FIGS. 1-3 are views of a method of manufacturing a semiconductor structure during forming insulating areas and active areas according some embodiments of the present disclosure, wherein FIG. 1 is a top view of a semiconductor structure with insulating areas and active areas according some embodiments of the present disclosure, and FIGS. 2-3 are cross-sectional views taken along a section-line NN' of FIG. 1 during one of forming insulating areas and active areas according some embodiments of the present disclosure, respectively.

As shown in FIG. 1 and FIG. 2, insulating areas 104 and active areas 106 are formed in a substrate 102. The substrate 102 is a semiconductor material, which may include silicon, such as crystalline silicon, polycrystalline silicon or amorphous silicon. In some embodiments, the substrate 102 may include an elemental semiconductor, such as germanium (Ge). In some embodiments, the substrate 102 may include alloy semiconductors such as silicon germanium (SiGe), silicon carbide phosphide (SiPC), gallium arsenide phosphide (GaAsP), aluminum indium arsenide (AlInAs), aluminum gallium arsenide (AlGaAs), gallium arsenide Indium gallium (GaInAs), gallium indium phosphide (GaInP), gallium indium phosphide (GaInAsP), or other suitable materials. In some embodiments, the substrate 102 may include compound semiconductors such as silicon carbide (SiC), silicon phosphide (SiP), gallium arsenide (GaAs), gallium phosphide (GaP), indium phosphide (InP), indium arsenide (InAs), Indium antimonide (InSb), zinc oxide (ZnO), zinc selenide (ZnSe), zinc sulfide (ZnS), zinc telluride (ZnTe), cadmium selenide (CdSe), cadmium sulfide (CdS), cadmium telluride (CdTe) or other suitable materials.

The insulating areas 104 are forming in the substrate 102. The material of the insulating areas 104 includes an oxide, such as silicon oxide. In some embodiments, each of the insulating areas 104 may be formed by a shallow trench isolation (STI) process. After the insulating areas 104 is formed, the semiconductor material situated around each of the insulating areas 104 and extending from the substrate 102 can respectively serve as the active areas 106. As well, each of the active areas 106 is adjacent to each of the insulating areas 104, and each of the insulating areas 104 separates the adjacent active areas 106.

Next, as shown in FIG. 3, source/drain (S/D) regions 108 are formed in the active areas 106 of the substrate 102. An ion implantation process may be performed on the substrate 102 to dope N-type or P-type dopants into the active areas 106 of the substrate 102. In some embodiments, the N-type dopants may include phosphorus or arsenic, and the P-type dopants include boron or boron fluoride.

Figure 4:
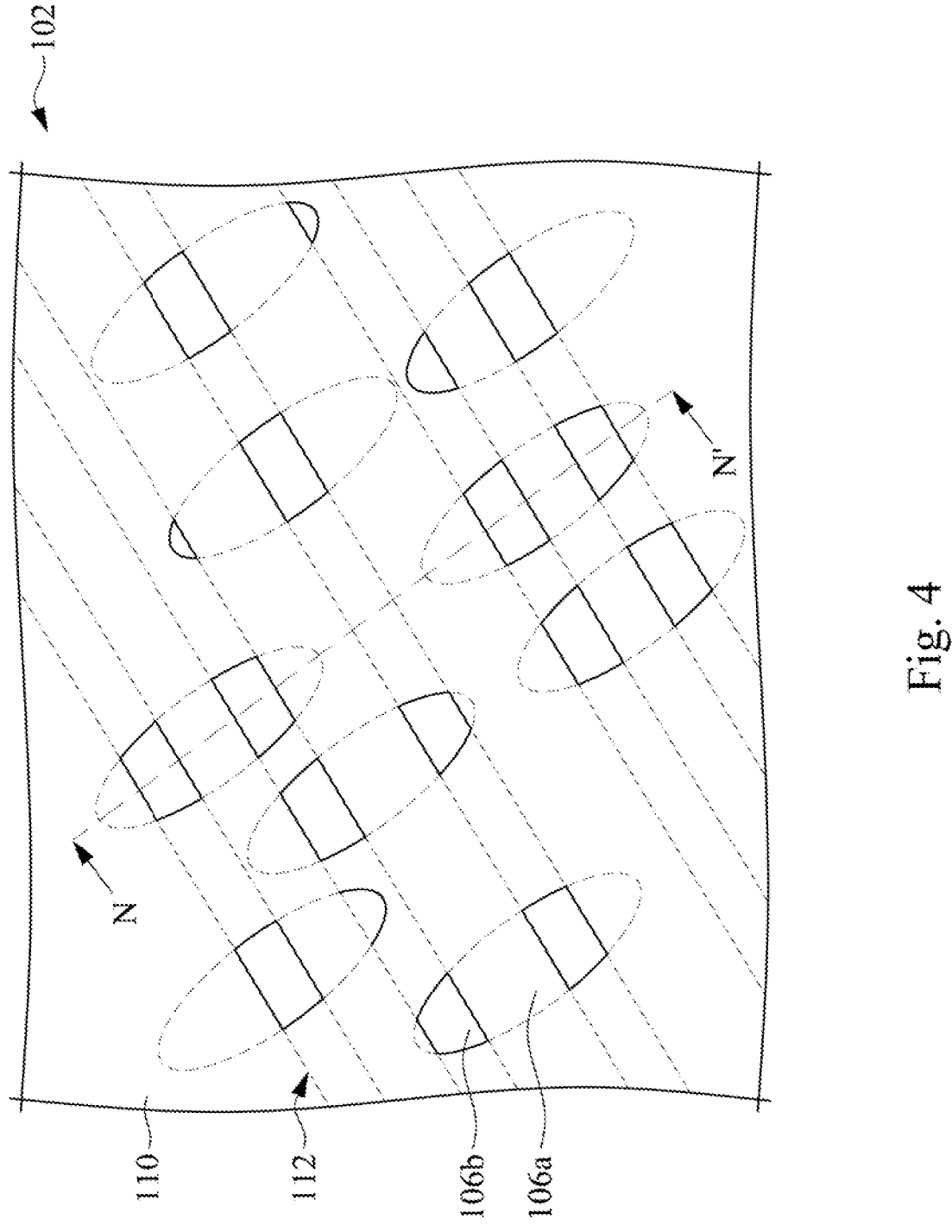
FIGS. 4-7 are views of a method of manufacturing a semiconductor structure during forming first word line trenches according some embodiments of the present disclosure.
Figure 5:
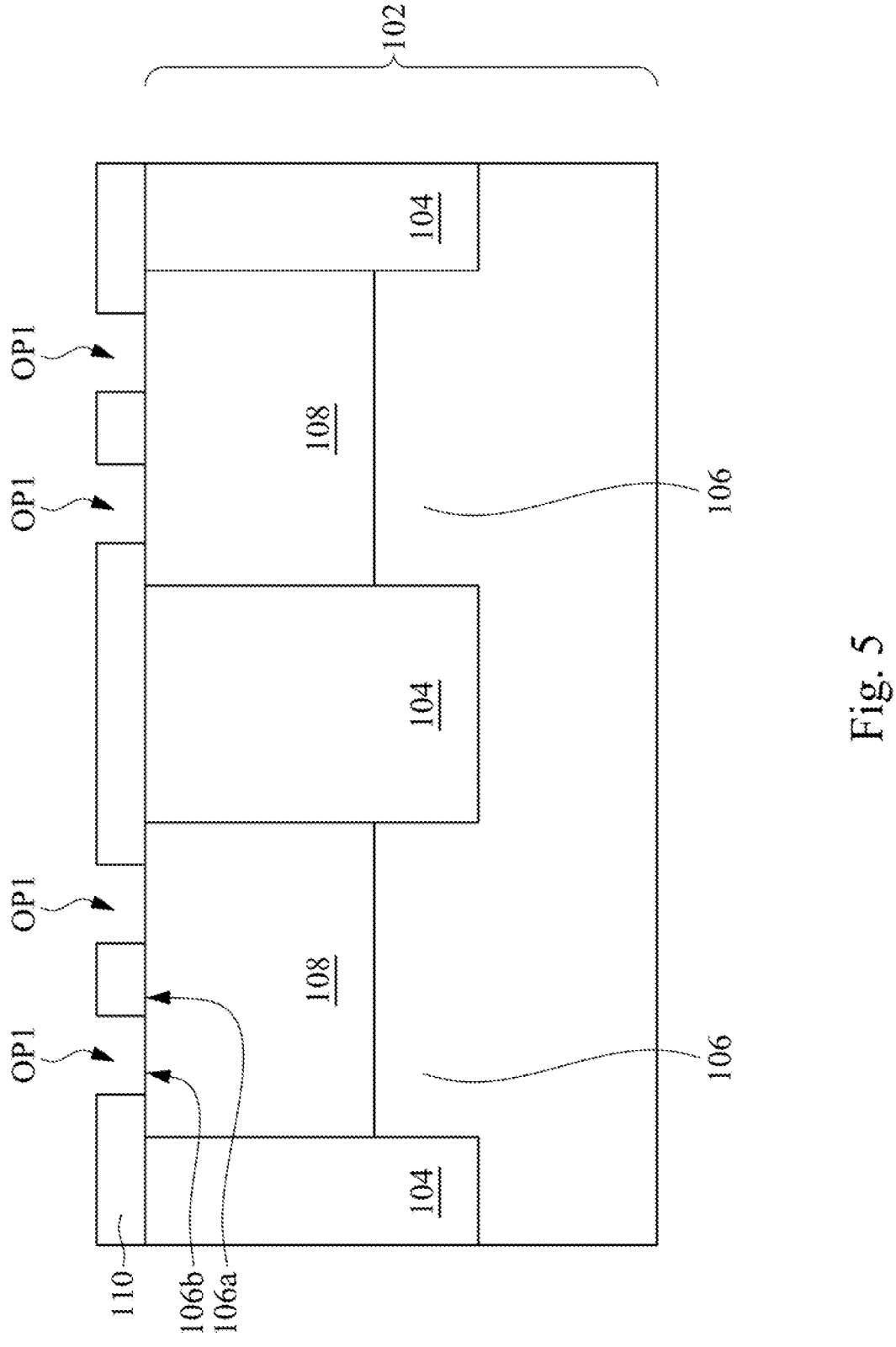
Figure 6:
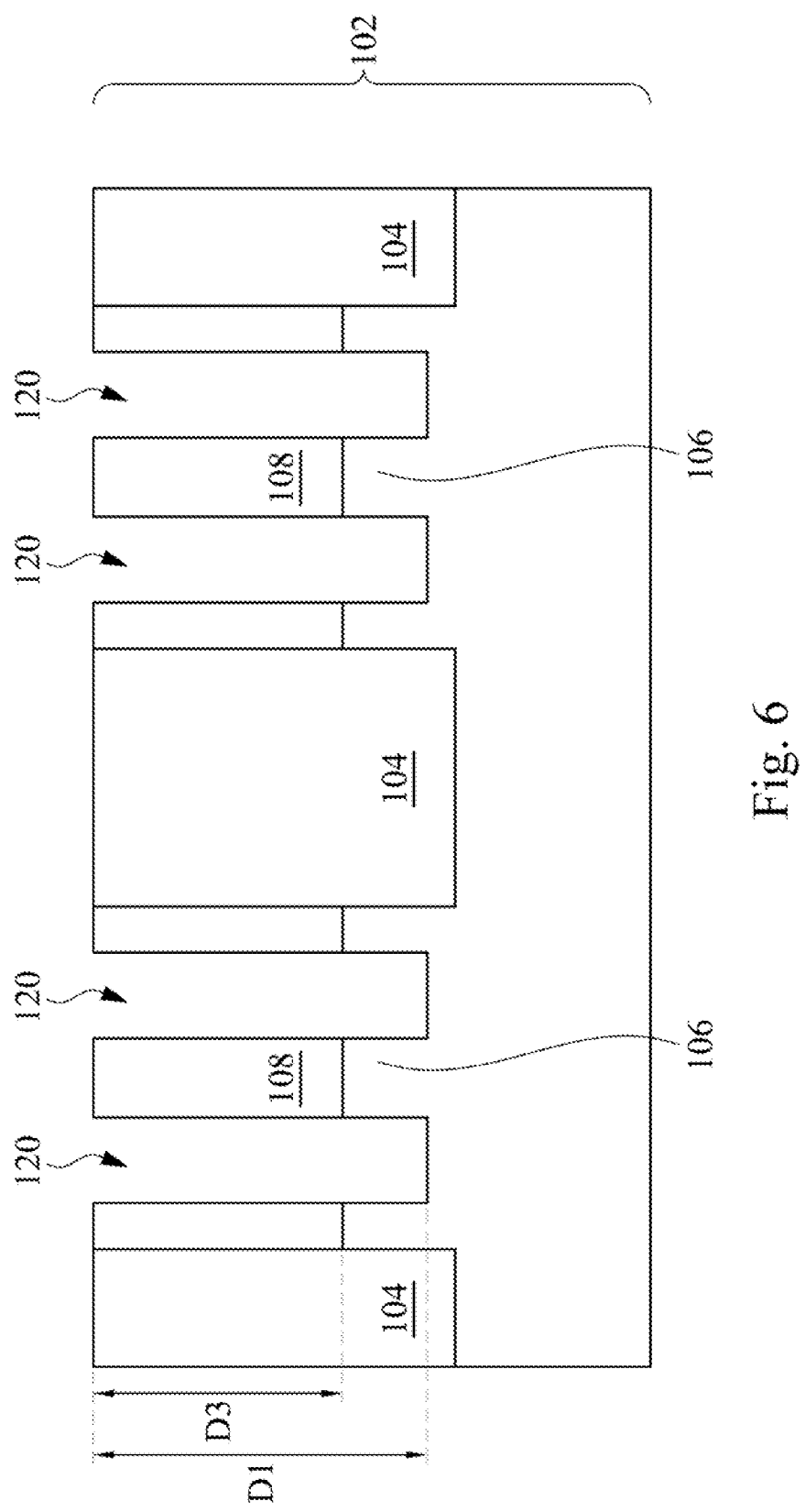
Figure 7:
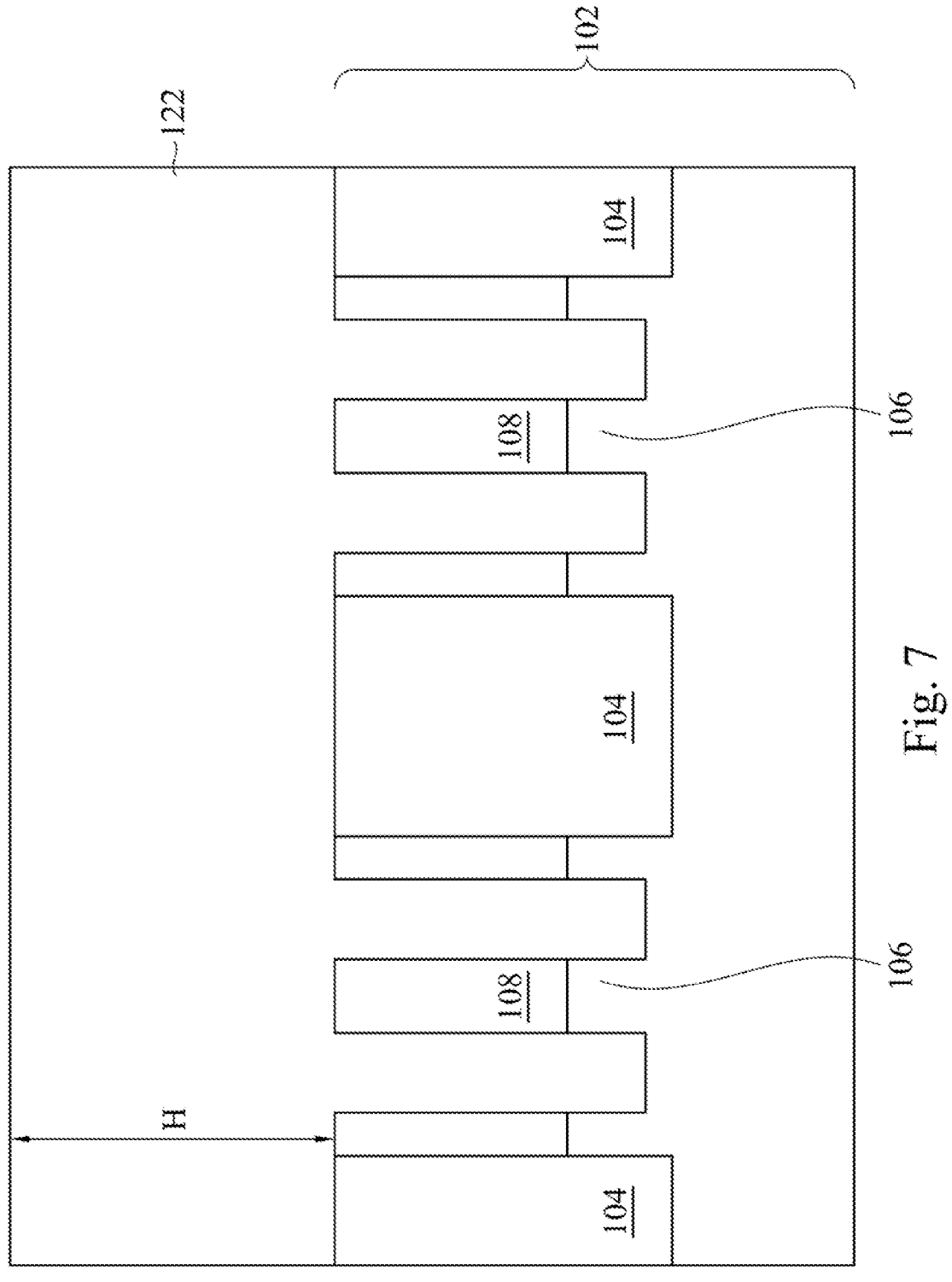

Next, please refer to FIGS. 4-7, FIGS. 4-7 are views of a method of manufacturing a semiconductor structure during forming first word line trenches according some embodiments of the present disclosure, wherein FIG. 4 is a top view of a semiconductor structure for forming first word line trenches according some embodiments of the present disclosure, and FIGS. 5-7 are cross-sectional views taken along a section-line NN' of FIG. 4 during one of forming first word line trenches process stages of manufacturing a semiconductor structure according to some embodiments of the present disclosure, respectively.

As shown in FIG. 4, a first mask layer 110 is formed on the surface of the insulating areas 104 and first parts 106*a* of the active areas 106. In the top view, through the first mask layer 110, a layout is formed on the surface of the insulating areas 104 and the active areas 106, which results in word line patterns 112 (as shown by the dotted line) extending through the insulating areas 104 and the active areas 106. In addition, as shown in FIG. 5, the first mask layer 110 is formed on the surface of the insulating areas 104 and the first parts 106*a* of the active areas 106, and the first mask layer 110 has first openings OP1 exposing second parts 106*b* of the active areas 106, that is, the second parts 106*b* of the active areas 106 is not covered by the first mask layer 110. It is noted that there are 4 first openings OP1 illustrated in FIG. 5, but the number of the first openings OP1 is not limited thereto. As well, only the active areas 106 is exposed by the first openings OP1 of the first mask layer 110, and the insulating areas 104 is not exposed by the first openings OP1 of the first mask layer 110. In some embodiments, the first mask layer 110 is a hard mask layer.

Then, as shown in FIG. 6, first word line trenches 120 is formed in the active area 106 corresponding to the first openings OP1. The first word line trenches 120 is linear and extends through the active areas 106 based on the word line pattern 112. Further, an appropriate etching process, such as a dry etching process or a wet etching process, is used to etching the active areas 106 corresponding to the first openings OP1 to form the first word line trenches 120. In addition, there are four first word line trenches 120 illustrated in FIG. 6, but the number of the first word line trenches 120 is not limited thereto. Also, each of the first word line trenches 120 has a first depth D1, and the first depth is greater than a third depth D3 of each of the S/D regions 108. In some embodiment, the first depth D1 is 270 nm.

Next, as shown in FIG. 7, a first dielectric layer 122 is deposited in the first word line trench 120 and on the active areas 106 and the insulating areas 104. As well, the first dielectric layer 122 is deposited such that a height H of the first dielectric layer 122 above the active areas 106 is equivalent to the second depth D2 (described in FIG. 10) of each of the second word line trenches 130, and the related descriptions will be described later. In some embodiments, the first dielectric layer 122 is formed of any suitable dielectric material. In some embodiments, the dielectric material may include an oxide, such as silicon oxide. In some embodiments, the formation method of the first dielectric layer 122 includes using an atomic layer deposition process, other suitable techniques or a combination thereof.

Figure 8:
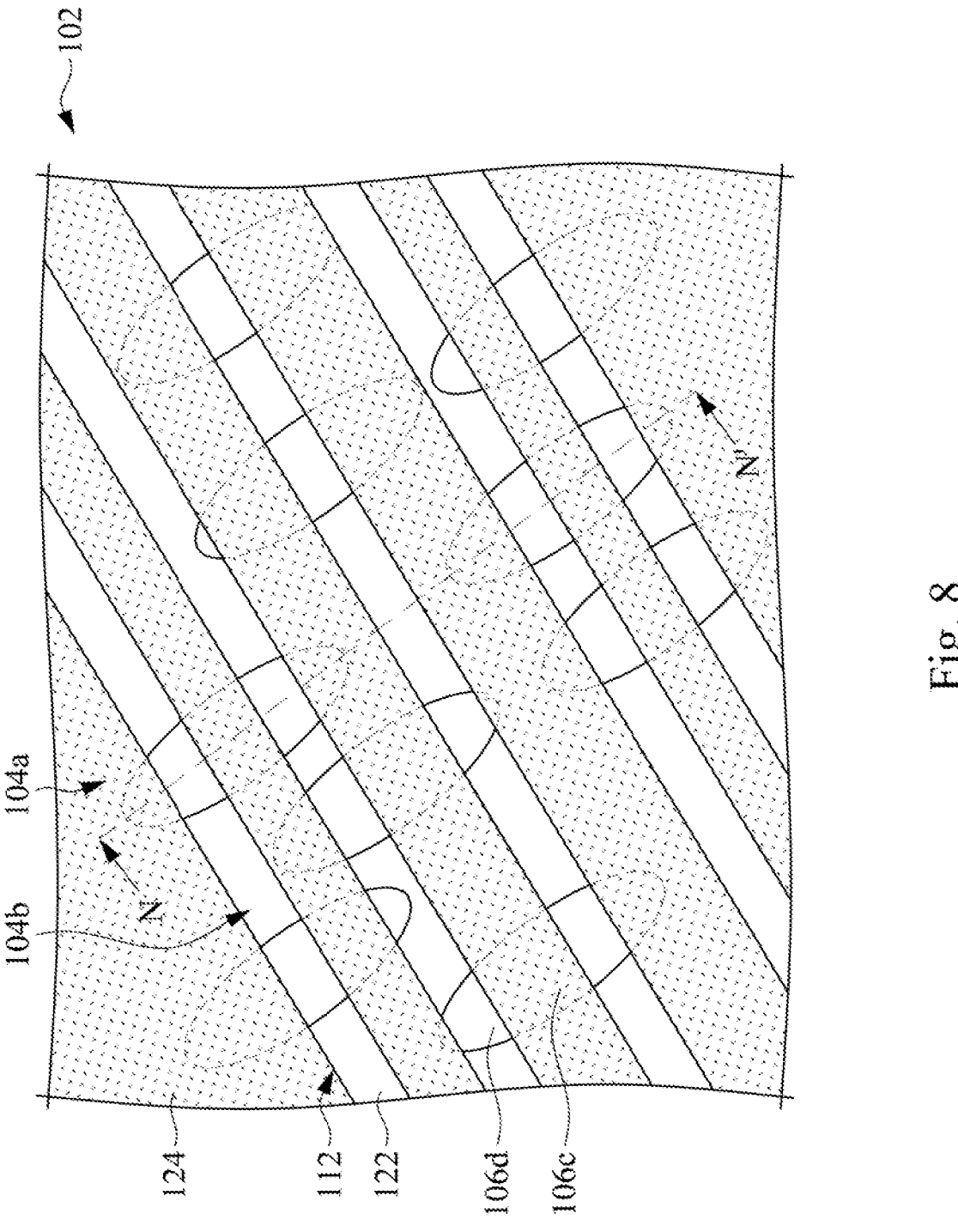
FIGS. 8-10 are views of a method of manufacturing a semiconductor structure during forming second word line trenches according some embodiments of the present disclosure.
Figure 9:
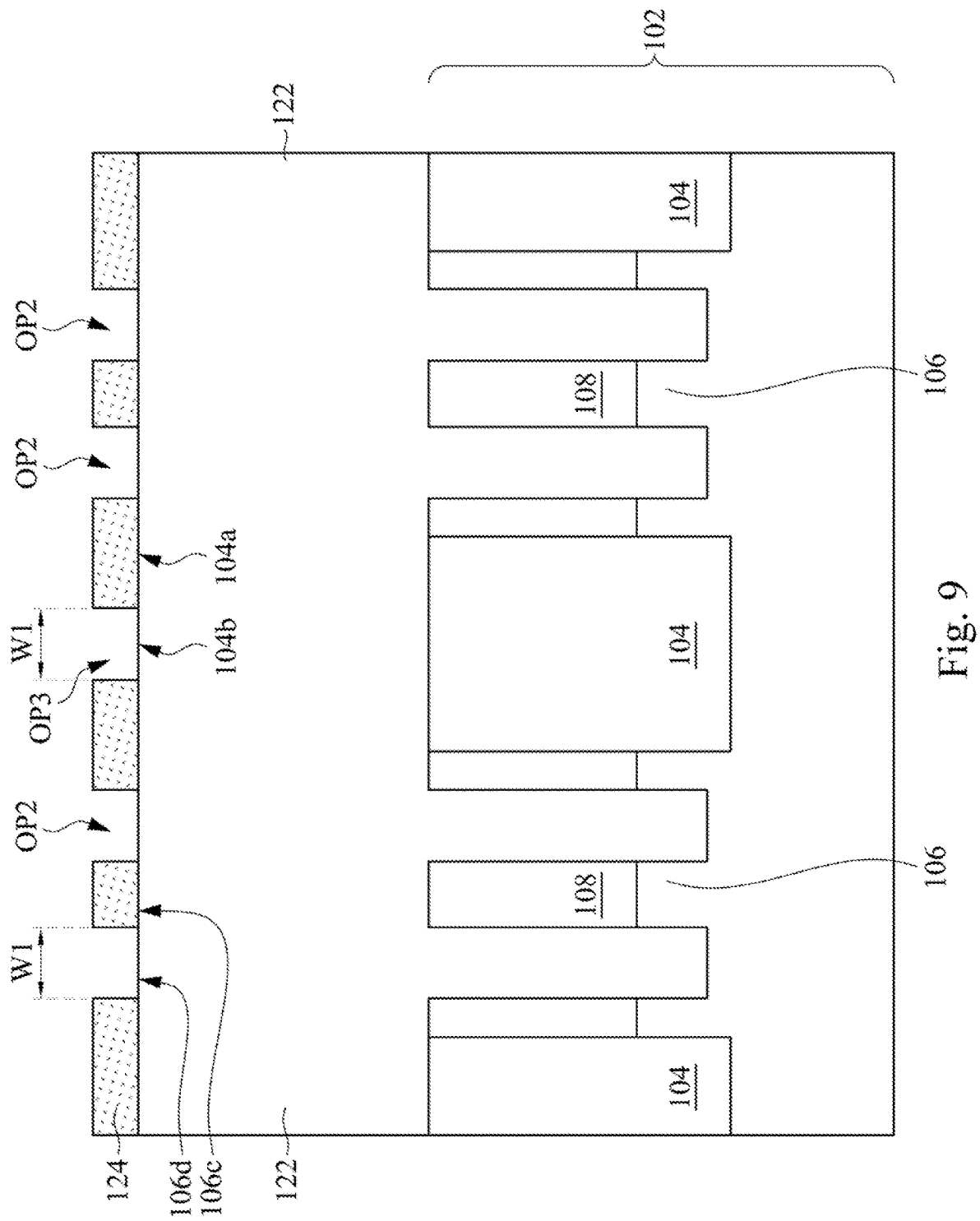
Figure 10:
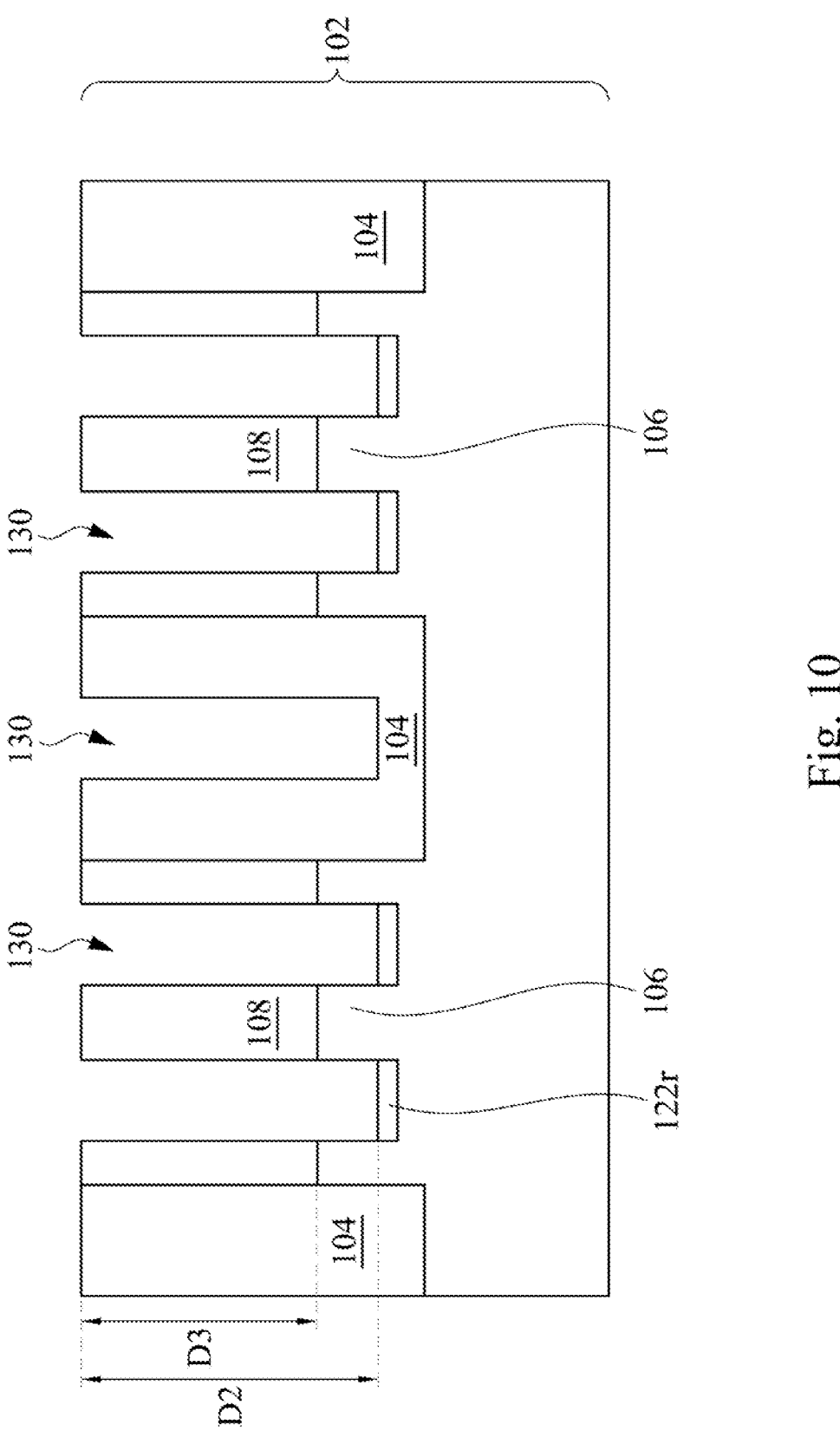

Further, please refer to FIGS. 8-10, FIGS. 8-10 are views of a method of manufacturing a semiconductor structure during forming second word line trenches according some embodiments of the present disclosure, wherein FIG. 8 is a top view of a semiconductor structure for forming second word line trenches according some embodiments of the present disclosure, and FIGS. 9-10 are cross-sectional views taken along a section-line NN' of FIG. 8 during one of forming second word line trenches process stages of manufacturing a semiconductor structure according to some embodiments of the present disclosure, respectively.

As shown in FIG. 8, a second mask layer 124 is formed on the surface of parts of the first dielectric layer 122 based on the word line pattern 112. To further description, as shown in FIG. 9, the second mask layer 124 is formed over first parts 104*a* of the insulating areas 104 and third parts 106*c* of the active areas 106. The second mask layer 124 has second openings OP2 exposing fourth parts 106*d* of the active areas 106, and the second mask layer 124 has third openings OP3 exposing second parts 104*b* of the insulating areas 104. In addition, the position of each of the second openings OP2 is disposed over each of the first word line trenches 120. It is worth mentioning that the width W1 of each of the opening OP2 is identical to the width W1 of each of the opening OP3. Also, there are four second openings OP2 and one third opening OP3 illustrated in FIG. 9, but the number of the seconds opening OP2 and the third openings OP3 are not limited thereto.

Next, as shown in FIG. 10, the second word line trenches 130 is formed in the substrate corresponding to the second openings OP2 and the third openings OP3. Also, each of the second word line trenches 130 is linear and extends through the insulating areas 104 and the active areas 106. Further, an appropriate etching process, such as a dry etching process or a wet etching process, is used to etching the active areas 106 to form the second word line trenches 130.

Moreover, after etching the first dielectric layer 122 (as shown in FIG. 9), a portion of the first dielectric layer 122 is remained in a bottom of the second word line trench 130 as a bottom dielectric layer 122*r*. After etched, each of the second word line trenches 130 has the second depth D2. In some embodiments, the second depth D2 is 145 nm. The second depth D2 is greater than the third depth D3 of each of the S/D regions 108, and the adjacent S/D regions 108 are disposed on opposite sides of each of the second word line trenches 130. In some embodiments, the first depth D1 of each of the first word line trenches 120 is greater than the second depth D2 of each of the second word line trenches 130. In some embodiments, the second depth D2 of each of the second word line trenches 130 is related to the aforementioned deposition height H, and in some embodiments, the second depth D2 of each of the second word line trenches 130 is equivalent to the aforementioned deposition height H. Also, in this step, since the same dielectric material, such as the oxide, is etched in the active areas 106 and the insulating areas 104, the etched depths of each of the second word line trenches in the insulating areas 104 and the actives areas 106 are easier to be controlled. Moreover, the etched depths of each of the second word line trenches 130 in the insulating areas 104 and the actives areas 106 are the same.

Figure 11:
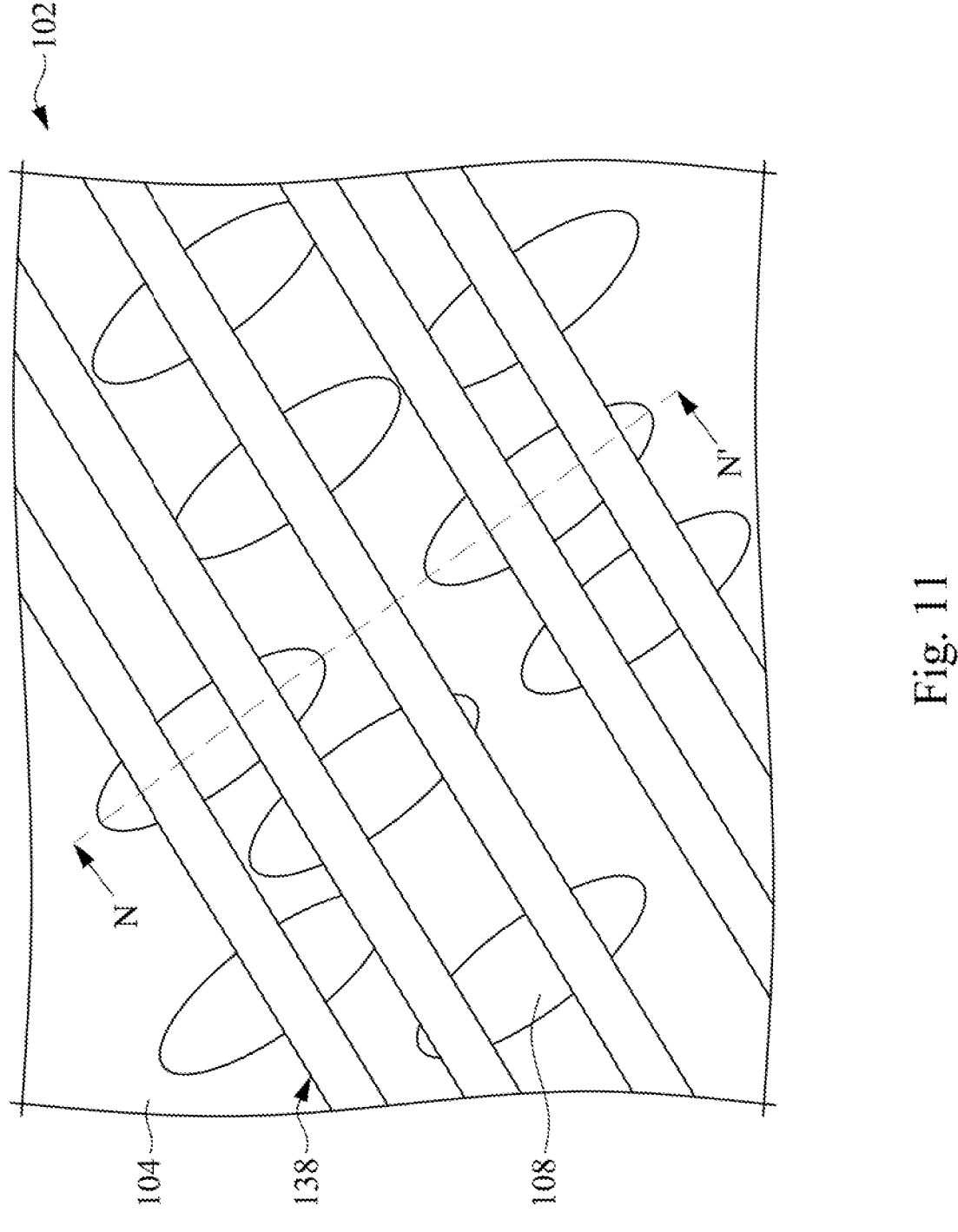

Furthermore, please refer to FIG. 11, FIG. 11 is a top view of a semiconductor structure with word line structures according to some embodiments of the present disclosure. The word line structures 138 are formed in the insulating areas 104 and the active areas 106, and each of the word line structures 138 is linear and extends through the insulating areas 104 and the active areas 106. The details about forming the word line structures 138 are described as follow.

Figure 12:
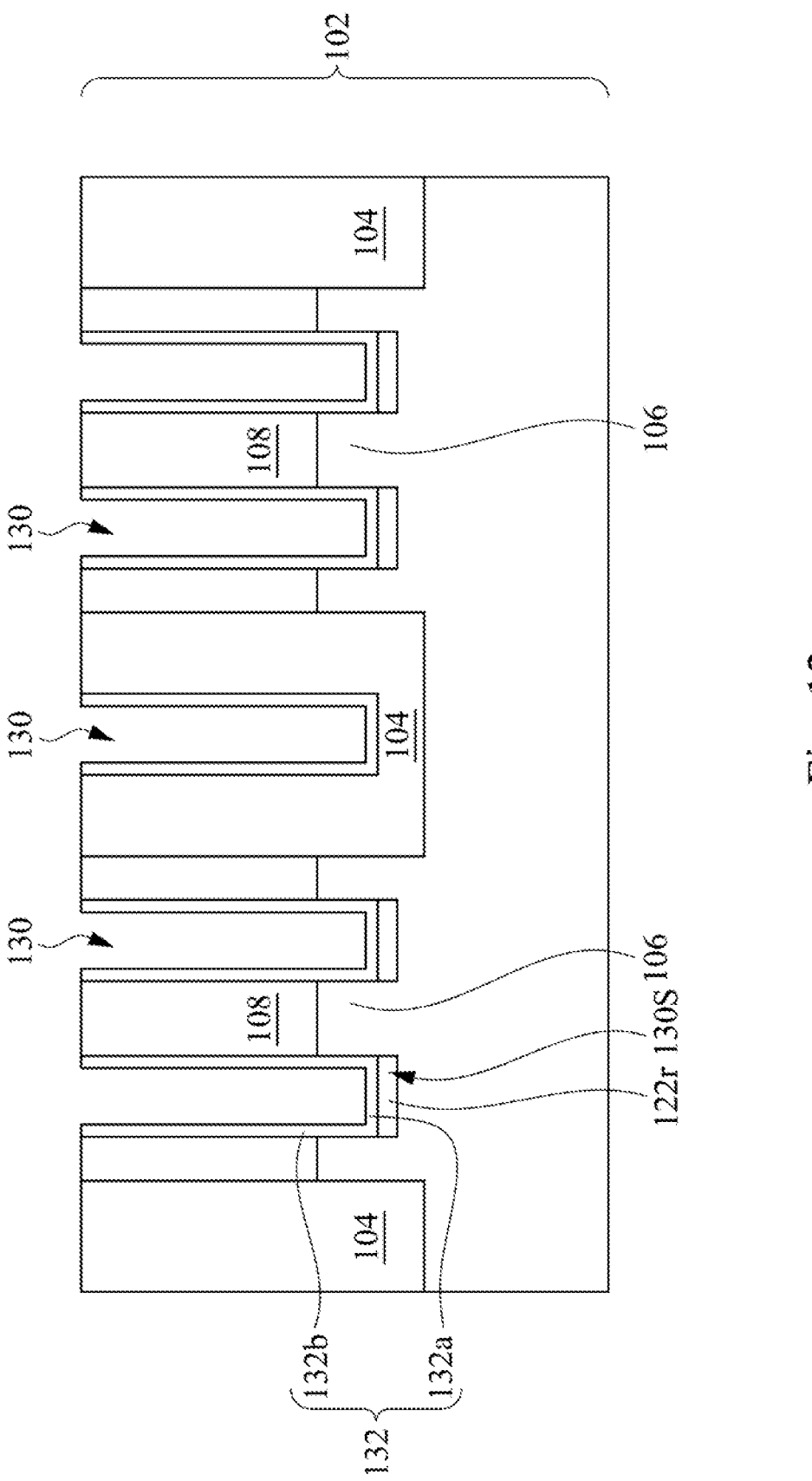
Figure 13:
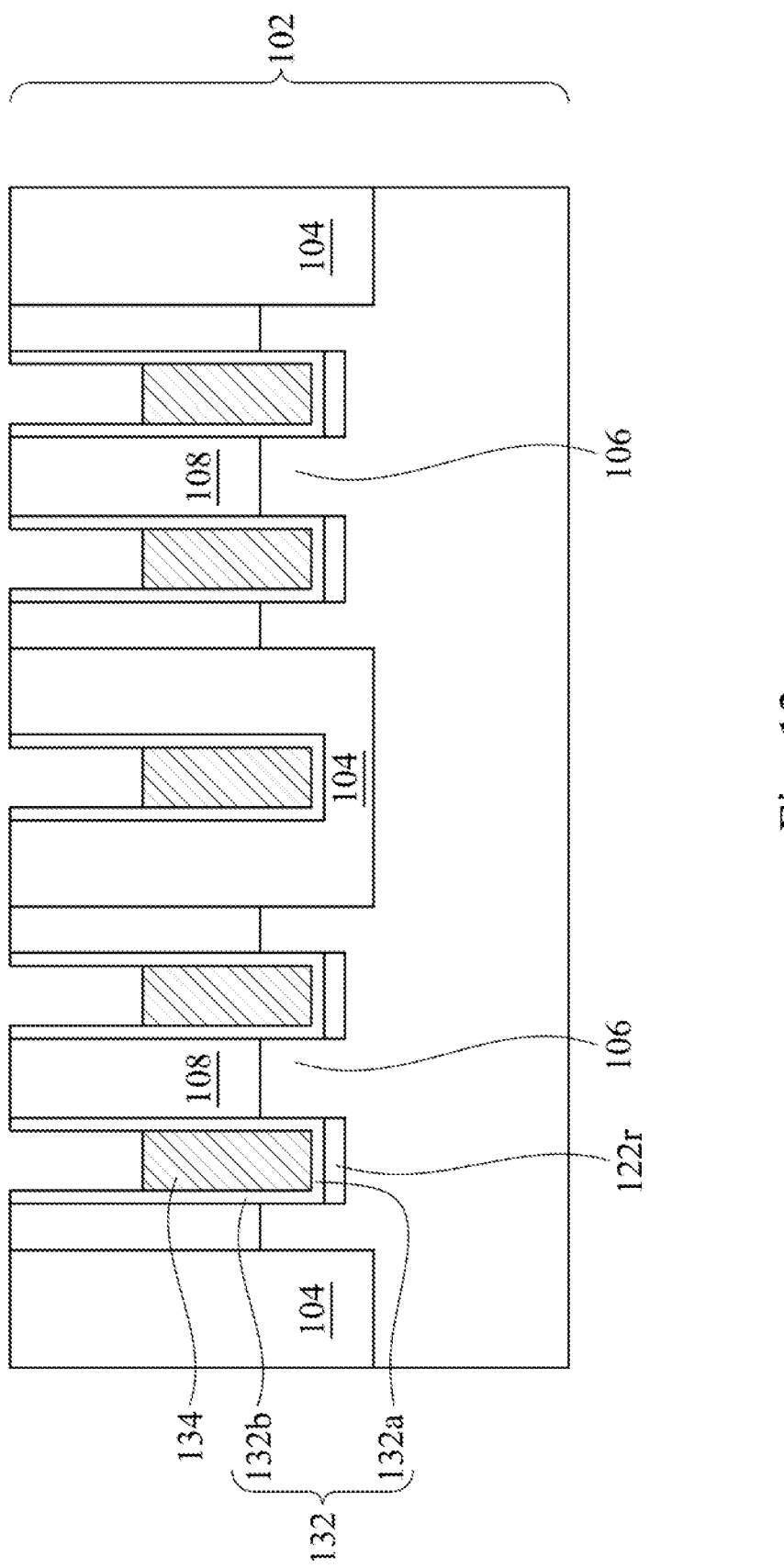
Figure 14:
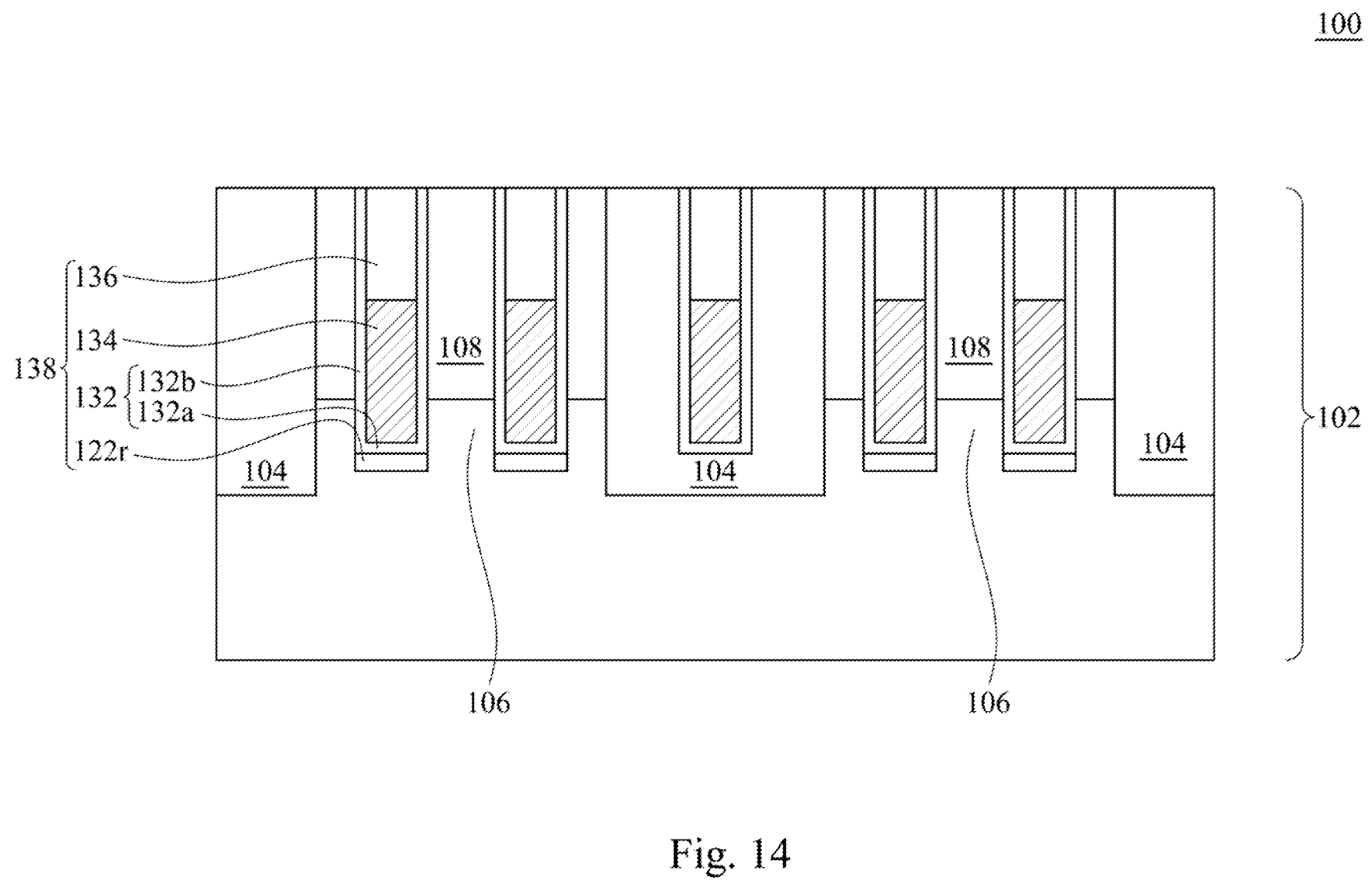

Please refer to FIGS. 12-14, FIGS. 12-14 are cross-sectional views taken along a section-line NN' of FIG. 11 during one of forming word line structures process stages of manufacturing a semiconductor structure according to some embodiments of the present disclosure. A liner dielectric layer 132 is formed on an inner surface 130S of each of the second word line trenches 130. The liner dielectric layer 132 includes a bottom portion and a side portion. In some embodiments, the liner dielectric layer 132 may conformally cover the inner surface 130S of each of the second word line trenches 130. The liner dielectric layer 132 is formed of any suitable dielectric material, which may include silicon oxide or high dielectric constant materials. In some embodiment, the high dielectric constant materials are hafnium oxide ($HfO_2$), zirconium oxide ($ZrO_2$), tantalum pentoxide ($Ta_2O_5$) or a combination thereof. The method of forming the liner dielectric layer 132 on the inner surface 130S of each of the second word line trenches 130 may include using chemical vapor deposition (CVD) process, ALD process, oxygen plasma oxidation process, thermal oxidation process, other suitable techniques, or a combination thereof. The liner dielectric layer 132 includes a bottom liner dielectric layer 132a and a side liner dielectric layer 132b. It is worth mentioning that a bottom of the word line structure 138 has the bottom dielectric layer 122r and the bottom liner dielectric layer 132a, and a side of the word line structure 138 simply has the side liner dielectric layer 132b. Therefore, the dielectric material at the bottom of the word line structure 138 is thicker than the dielectric material at the side of the word line structure 138.

Next, as shown in FIG. 13, a conductive layer 134 is formed within each of the second word line trenches 130 and contact the bottom portion of the liner dielectric layer 132 and the side portion of the liner dielectric layer 132. The location of the conductive layer 134 at least partially overlaps with each of the S/D regions 108, that is, the S/D regions 108 are disposed on opposite sides of the conductive layer 134. In some embodiments, the conductive layer 134 is formed of any suitable conductive material, such as semiconductor, metal, metal nitride, metal silicide, other suitable conductive materials or a combination thereof. For example, the conductive layer 134 may include doped polysilicon, titanium (Ti), tungsten (W), tantalum (Ta), titanium nitride (TiN), tungsten nitride (WN), tantalum nitride (TaN), Titanium silicon nitride (TiSiN), tantalum silicon nitride (TaSiN), tungsten silicon nitride (WSiN), other suitable conductive materials or a combination thereof.

Further, as shown in FIG. 14, a cap layer 136 is formed within each of the second word line trenches 130 and stacks on the conductive layer 134. In some embodiments, the material of the cap layer 136 may include silicon oxide, silicon nitride, silicon oxynitride or a combination thereof. After the steps in FIG. 14, the semiconductor structure 100 with the word line structures 138 has been completed. Also, each of the word line structures 138 in the insulating areas 104 is equivalent to each of the word line structures 138 in the active areas 106. For example, the depth of each of the word line structures 138 in the insulating areas 104 is equal to the depth of each of the word line structures 138 in the active areas 106, that is, both of the depths of each of the word line structures 138 in the insulating areas 104 and the active areas 106 are the first depth D1 of each of the first word line trenches 120.

Via the method of manufacturing the semiconductor structure 100 provided by the embodiments of the present disclosure, the first word line trench 120 are only formed in active areas 106 through the first openings OP1 of the first mask layer 110, and then the dielectric material is refilled in each of the first word line trenches 120 and over the substrate 102. Then, the second word line trench 130 are formed in the active areas 106 and the insulating areas 104 through the second openings OP2 and the third openings OP3 of the second mask layer 124, and each of the parts of the active areas 106 exposed by the first openings OP1 and the second openings OP2 is the same. Also, only the dielectric material needs to be etched when forming the second word line trenches 130 because the first depth D1 of each of the first word line trenches 120 is greater than the second depth D2 of each of the second word line trenches 130. Thus, without taking into account the different etching rates of silicon (the active areas 106) and the dielectric material (the insulating areas 104) in the substrate 102, the depths of the word line structures 138 in the active areas 106 and the word line structure s138 in the insulating areas 104 are easier to be controlled, so that the semiconductor structure 100 with better performance can be obtained.

Furthermore, there are some technical features of the semiconductor structure 100 with the word line structure 138. Please refer to FIG. 15, FIG. 15 is a schematic diagram of a semiconductor structure according to some embodiments of the present disclosure.

Figure 15:
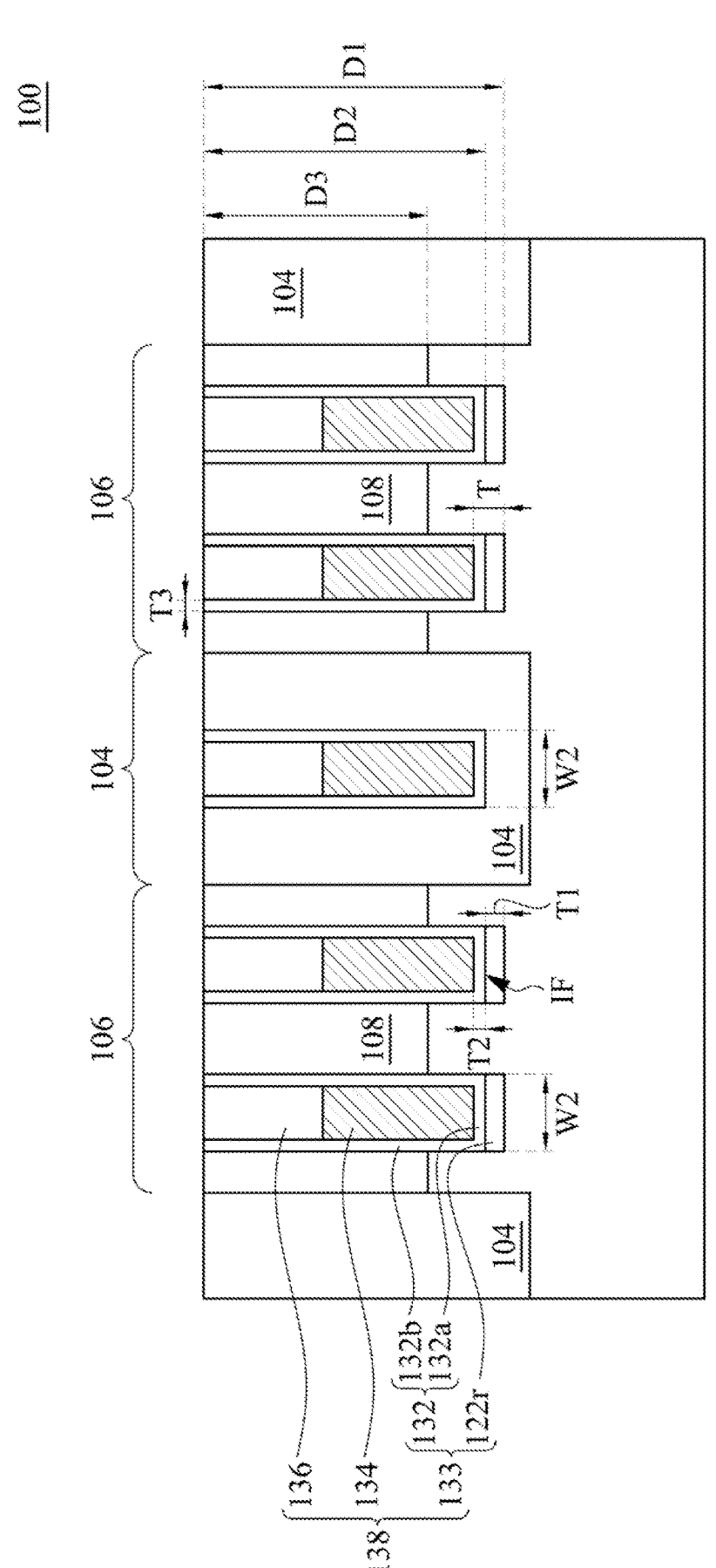
FIG. 15 is a cross-sectional view of a semiconductor structure according to some embodiments of the present disclosure.

As shown in FIG. 15, the semiconductor structure 100 is provided by embodiments of the present disclosure. The semiconductor structure 100 includes the substrate 102 and the word line structure 138. The substrate 102 includes the insulating areas 104 and the active areas 106. The word line structure 138 is linear and extends the insulating area 104 and the active area 106. Also, each of the active areas 106 includes the adjacent S/D regions 108, and the S/D regions are disposed on the opposite sites of the word line structure 138.

The word line structure 138 includes the dielectric layer 133, the conductive layer 134 and the cap layer 136. The dielectric layer 133 includes a bottom portion and a side portion. The bottom portion of the dielectric layer 133 contacts a bottom of the conductive layer 134, and the side portion of the dielectric layer 133 contacts a sidewall of the conductive layer 134. Also, the dielectric layer 133 includes the bottom dielectric layer 122r and the liner dielectric layer 132. Further, the liner dielectric layer 132 comprises a bottom liner dielectric layer 132a and a side liner dielectric layer 132b. The bottom portion of the dielectric layer 133 includes the bottom dielectric layer 122r and the bottom liner dielectric layer 132a, and an interface IF is between the bottom dielectric layer 122r and the bottom liner dielectric layer 132a. The cap layer 136 is disposed on the conductive layer 134.

Moreover, as shown in FIG. 15, the depth of the word line structure 138 is the first depth D1, the depth of the bottom liner dielectric layer 132a is the second depth D2, and the depth of each of the S/D regions is the third depth D3. The first depth D1 is greater than the second depth D2, and the second depth D2 is greater than the third depth D3. As well, the location of the conductive layer 134 of the word line structure 138 at least partially overlaps with the S/D region 108. That is, the adjacent S/D regions 108 are disposed on the opposite sites of the conductive layer 134.

As shown in FIG. 15, a bottom thickness T of the word line structure 138 is a first thickness T1 of the bottom dielectric layer 122*r* plus a second thickness T2 of the bottom liner dielectric layer 132*a*. Thus, a bottom of the dielectric layer 133 is thicker than a side of the dielectric layer 133, that is, the bottom thickness T of the word line structure 138 is greater than a third thickness T3 of the word line structure 138. Additionally, the width W2 of the word line structure 138 in each of the active areas 106 is identical to the width W2 of the word line structure 138 in each of the insulating area 104.

Via the embodiments of the present disclosure, no matter whether the word line structures 138 disposed in the active areas 106 or in the insulating areas 104 are equivalent, for example, the depth of each of the word line structures 138 in the active areas 106 and the depth of each of the word line structures 138 in the insulating areas 104 are the same. Accordingly, the semiconductor structure 100 provided by the embodiments of the present disclosure can solve the problems of electrical loss caused by the different depths between the word line structure in the active area and the insulating area. In addition, the semiconductor structure 100 provided by the embodiments of the present disclosure can reduce the problems of leakage.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure, comprising
   a substrate, comprising an insulating area and an active area; and
   a word line structure, linear and extending through the insulating area and the active area, the word line structure comprising:
   a conductive layer; and
   a dielectric layer, comprising a bottom portion contacting a bottom of the conductive layer and a side portion contacting a sidewall of the conductive layer, wherein the bottom portion of the dielectric layer is thicker than the side portion of the dielectric layer
   wherein the bottom portion of the dielectric layer comprises a bottom dielectric layer and a bottom liner dielectric layer, and an interface is between the bottom dielectric layer and the bottom liner dielectric layer, and
   wherein a width of the bottom liner dielectric layer vertically projected to the substrate is substantially identical to a width of the bottom dielectric layer vertically projected to the substrate.

2. The semiconductor structure according to claim 1, wherein the word line structure further comprises:
   a cap layer, disposed on the conductive layer.

3. The semiconductor structure according to claim 1, wherein the active area comprises a plurality of source/drain regions, and the plurality of the source/drain regions are disposed on opposite sides of the conductive layer.

4. The semiconductor structure according to claim 3, wherein a depth of the word line structure is a first depth, a depth of the bottom liner dielectric layer of the word line structure is a second depth, and a depth of each of the plurality of source/drain regions is a third depth.

5. The semiconductor structure according to claim 4, wherein the first depth is greater than the second depth, and the second depth is greater than the third depth.

* * * * *